(12) United States Patent
Wei et al.

(10) Patent No.: US 7,915,660 B2
(45) Date of Patent: Mar. 29, 2011

(54) JUNCTION-FREE NAND FLASH MEMORY AND FABRICATING METHOD THEREOF

(75) Inventors: Houng-Chi Wei, Hsinchu (TW); Shi-Hsien Chen, Hsinchu (TW); Hsin-Heng Wang, Hsinchu County (TW); Shih-Hsiang Lin, Taipei County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 12/468,074

(22) Filed: May 19, 2009

(65) Prior Publication Data
US 2010/0295117 A1    Nov. 25, 2010

(51) Int. Cl.
*H01L 29/78* (2006.01)
*H01L 21/336* (2006.01)

(52) U.S. Cl. ........... 257/314; 257/E27.103; 257/E21.68; 438/257

(58) Field of Classification Search .......... 257/314–326, 257/E27.081, E27.102, E27.103, E21.662, 257/E21.68, E21.681, E21.682, E21.683; 438/257–267
See application file for complete search history.

(56) References Cited

U.S. PATENT DOCUMENTS

| 6,992,929 | B2 | 1/2006 | Chen et al. | |
|---|---|---|---|---|
| 2006/0065921 | A1* | 3/2006 | Willer et al. | 257/324 |
| 2006/0199333 | A1* | 9/2006 | Chu et al. | 438/257 |
| 2007/0014155 | A1* | 1/2007 | Yoshino | 365/185.17 |

* cited by examiner

*Primary Examiner* — Sue A Purvis
*Assistant Examiner* — Kevin Quinto
(74) *Attorney, Agent, or Firm* — Jianq Chyun IP Office

(57) ABSTRACT

A junction-free NAND flash memory is described, including a substrate, memory cells, source/drain inducing (SDI) gates electrically connected with each other, and a dielectric material layer. The memory cells are disposed on the substrate, wherein each memory cell includes a charge storage layer. Each SDI gate is disposed between two neighboring memory cells. The dielectric material layer is disposed between the memory cells and the SDI gates and between the SDI gates and the substrate.

21 Claims, 5 Drawing Sheets

JUNCTION-FREE NAND FLASH MEMORY AND FABRICATING METHOD THEREOF

BACKGROUND OF THE INVENTION

1. Field of the Invention

This invention relates to a semiconductor device and its fabrication, and more particularly to a junction-free NAND flash memory and a fabricating method thereof.

2. Description of Related Art

Flash memory is a type of non-volatile memory that can be programmed and erased electrically and can retain data even after the power is off, which is widely adopted in personal computers (PC) and other electronic apparatuses.

A conventional method for fabricating a MOS memory cell includes, after the formation of a stacked gate structure constituted of a tunnel oxide layer, a floating gate, a dielectric layer and a control gate, performing a doping step to the substrate with the gate structure as a mask. With a long period of high-temperature annealing conducted subsequently, source/drain regions with a larger area and a deeper junction is formed.

In programming of the memory, appropriate biases depending upon the channel length are applied to the source/drain regions from corresponding bit lines, such that hot electrons are produced in the channel and partially injected to the floating gate through the tunnel oxide.

In the trend of high device integration, the device size is reduced so that the channel length of the floating gate is reduced, while the depletion regions produced by the source/drain regions further reduce the channel length. Since the annealing of the source/drain is conducted at a high temperature for a long period, the depletion region of the source may merge with that of the drain. This makes problems such as short channel effect and punch-through leakage worse.

SUMMARY OF THE INVENTION

Accordingly, this invention provides a junction-free NAND flash memory capable of effectively suppressing the short channel effect.

This invention also provides a method of fabricating a junction-free NAND flash memory of this invention.

The junction-free NAND flash memory includes a substrate, a plurality of memory cells, a plurality of source/drain inducing (SDI) gates electrically connected with each other, and a dielectric material layer. The memory cells are disposed on the substrate, wherein each memory cell includes a charge storage layer. Each SDI gate is disposed between two neighboring memory cells. The dielectric material layer is disposed between the memory cells and the SDI gates and between the SDI gates and the substrate.

In an embodiment of the junction-free NAND flash memory, each memory cell includes a control gate, and a composite layer that is disposed between the control gate and the substrate and includes a bottom dielectric layer, the charge storage layer and a top dielectric layer.

In an embodiment of the junction-free NAND flash memory, the charge storage layer includes silicon nitride or doped polysilicon.

In an embodiment of the junction-free NAND flash memory, the SDI gates include a conductive material. The conductive material may include doped polysilicon or metal.

In an embodiment, the junction-free NAND flash memory further includes a silicide layer disposed on each SDI gate while the SDI gates include doped polysilicon.

In an embodiment of the junction-free NAND flash memory, the dielectric material layer includes silicon nitride.

In an embodiment, the junction-free NAND flash memory further includes a connection line electrically connecting the SDI gates.

In an embodiment, the junction-free NAND flash memory further includes a plurality of spacers, each of which is disposed between a memory cell and a SDI gate. The spacers may include silicon oxide.

The method of fabricating a junction-free NAND flash memory of this invention includes the following steps. A substrate having a plurality of memory cells thereon is provided, wherein each memory cell includes a charge storage layer, and a space is formed between two neighboring memory cells. A dielectric material layer is conformally formed on the substrate covering the memory cells. A plurality of SDI gates electrically connected with each other is formed, each filling the space between two neighboring memory cells.

In an embodiment of the above method, each memory cell includes a control gate, and a composite layer that is disposed between the control gate and the substrate and includes a bottom dielectric layer, the charge storage layer and a top dielectric layer.

In an embodiment, the above method further includes forming a connection line connecting the SDI gates while forming the SDI gates. The step of forming the SDI gates and the connection line may include the following steps. A filling layer is formed on the substrate filling the spaces between the memory cells. The filling layer is planarized until the dielectric material layer over the memory cells is exposed. The portions of the filling layer in the spaces are removed, and an additional portion of the filling layer is removed to form a connection line opening that connects the spaces. A conductive layer is formed over the substrate filling the spaces and the connection line opening. The conductive layer is planarized until the dielectric material layer over the memory cells is exposed.

In the above embodiment, the filling layer may include a dielectric material, the step of planarizing the filling layer may include a chemical mechanical polishing (CMP) process, and the step of planarizing the conductive layer may include a CMP process.

In an embodiment, the above method further includes forming spacers on the sidewalls of the memory cells respectively before the dielectric material layer is formed. The spacers may be formed with the following steps. A spacer material layer is conformally formed over the substrate covering the memory cells. An etching back process is performed to the spacer material layer.

In an embodiment of the above method, the SDI gates include doped polysilicon or metal.

In an embodiment, the method further includes forming a silicide layer on each SDI gate while the SDI gates include doped polysilicon.

In the junction-free NAND flash memory of this invention, the SDI gates can induce source/drain regions while applied with a suitable voltage, so that no source/drain region has to be formed in the substrate by doping. Therefore, the short channel effect can be effectively suppressed, and punch-through leakage can be avoided.

It is to be understood that both the foregoing general description and the following detailed description are exemplary, and are intended to provide further explanation of the invention as claimed.

DESCRIPTION OF EMBODIMENTS

FIGS. 1A to 1E illustrate, in a schematic top view, a process of fabricating a junction-free NAND flash memory according to an embodiment of this invention. FIGS. 2A-2E are schematic cross-sectional views of the respective structures of FIGS. 1A-1E along line I-I'.

Figure 1A:
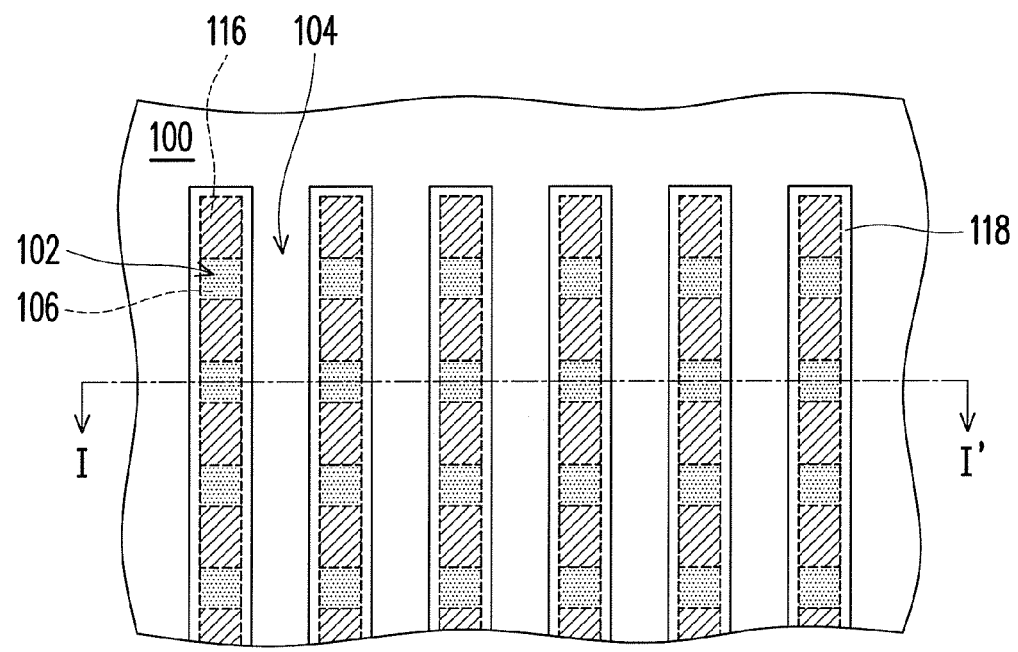
FIGS. 1A-1E illustrate, in a schematic top view, a process of fabricating a junction-free NAND flash memory according to an embodiment of this invention.
Figure 2A:
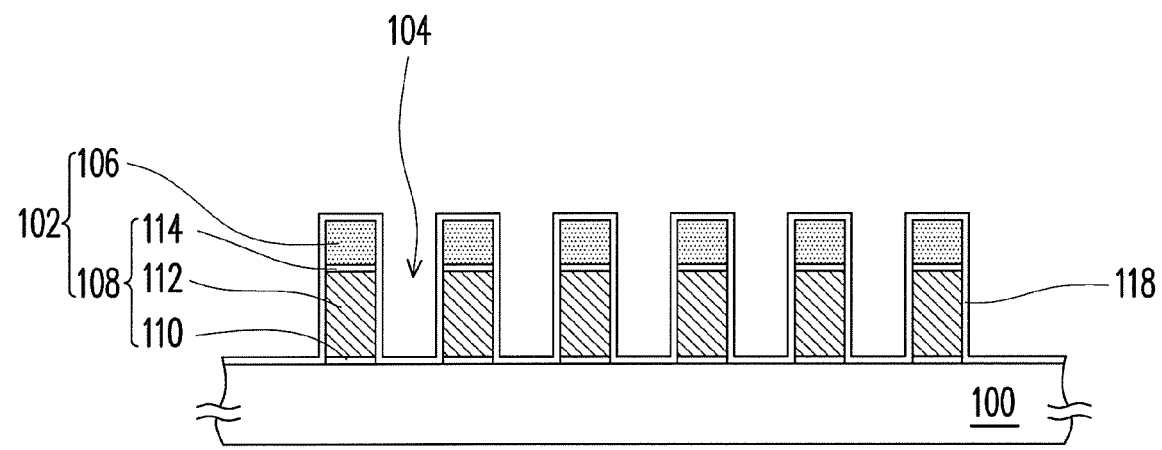
FIGS. 2A to 2E are schematic cross-sectional views of the respective structures of FIGS. 1A-1E along line I-I'.

Referring to FIGS. 1A and 2A, a substrate 100 having a plurality of memory cells 102 thereon is provided, wherein a space 104 is formed between two neighboring memory cells 102. Each memory cell 102 includes, for example, a control gate 106, and a composite layer 108 that is disposed between the control gate 106 and the substrate 100 and includes, for example, a bottom dielectric layer 110, a charge storage layer 112 and a top dielectric layer 114. The material of the bottom dielectric layer 110 is silicon oxide, for example. The material of the charge storage layer 112 is silicon nitride or doped polysilicon, for example. When the material of the charge storage layer 112 is doped polysilicon, it is a floating gate. When the material of the charge storage layer 112 is silicon nitride, it is a charge trapping layer. The material of the top dielectric layer 114 is silicon oxide or silicon oxide/silicon nitride/silicon oxide (ONO), for example. The substrate 100 further includes a plurality of word line 116 in the column direction, each electrically connecting the control gates 106 in one column. Possible methods for forming the memory cells 102 and the word lines 116 are well known to persons of ordinary skills in the art, and are therefore omitted here.

Afterwards, a spacer material layer 118 is conformally formed over the substrate 100 covering the memory cells 102. The material of the spacer material layer 118 is silicon oxide, for example. The spacer material layer 118 may be formed in a chemical vapor deposition (CVD) process, for example.

Figure 1B:
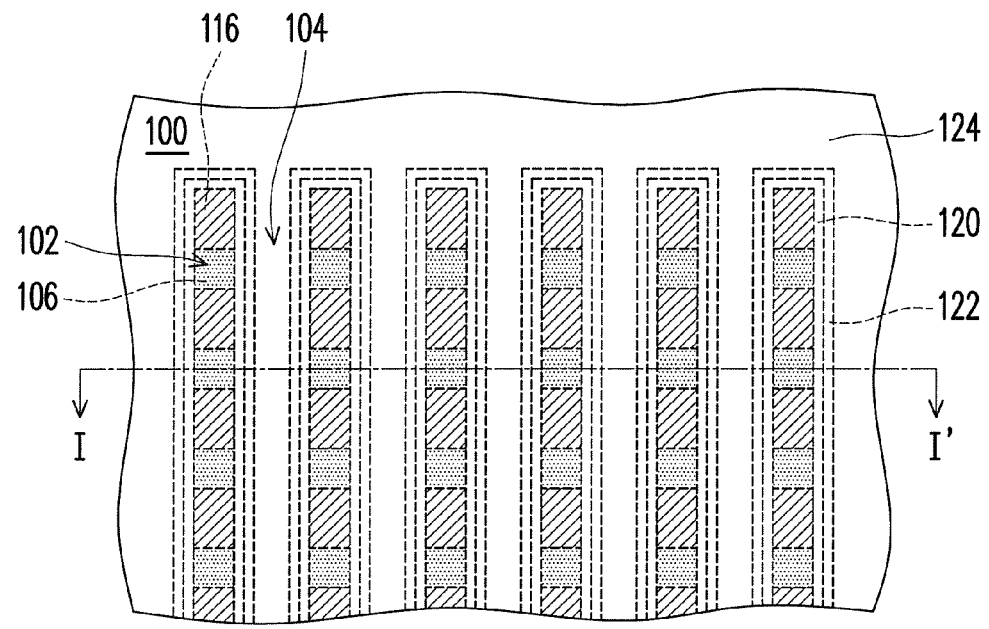
Figure 2B:
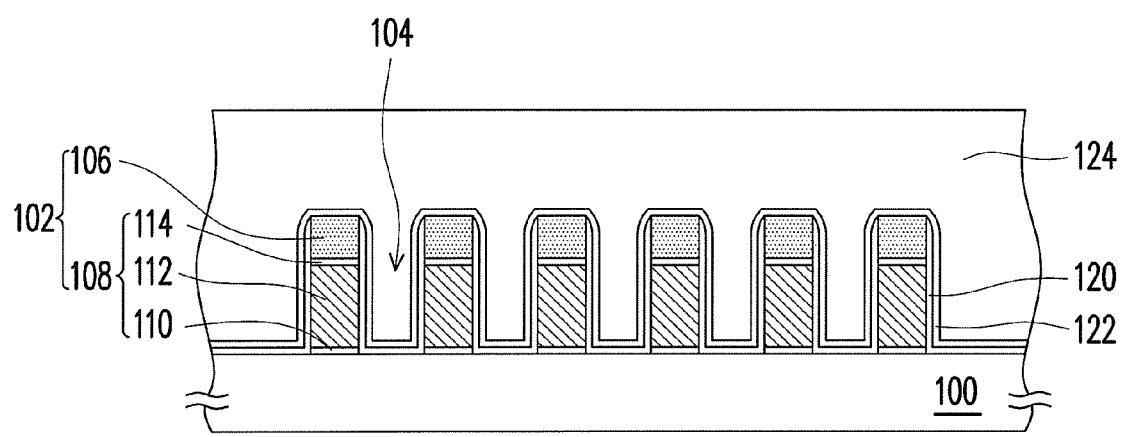

Then, referring to FIGS. 1B and 2B, an etching back process is performed to the spacer material layer 118 to form spacers 120 on the sidewalls of the memory cells 102. It is noted that the method of forming the spacers 120 is not limited to the above one, and even the forming steps of the spacers 120 may be omitted.

After that, a dielectric material layer 122 is conformally formed over the substrate 100 covering the memory cells 102. The material of the dielectric material layer 122 is silicon nitride, for example. The method of forming the dielectric material layer 122 is CVD, for example.

Next, a filling layer 124 is formed over the substrate 100 filling the spaces 104. The material of the filling layer 124 is a dielectric material, for example, such as silicon oxide. The method of forming the filling layer 124 is CVD, for example.

Figure 1C:
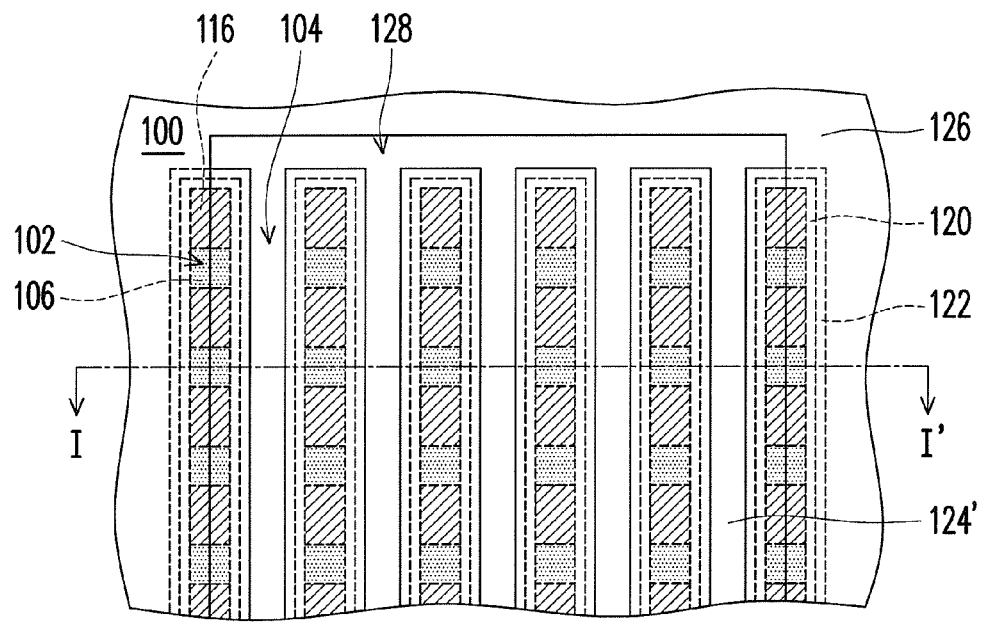
Figure 2C:
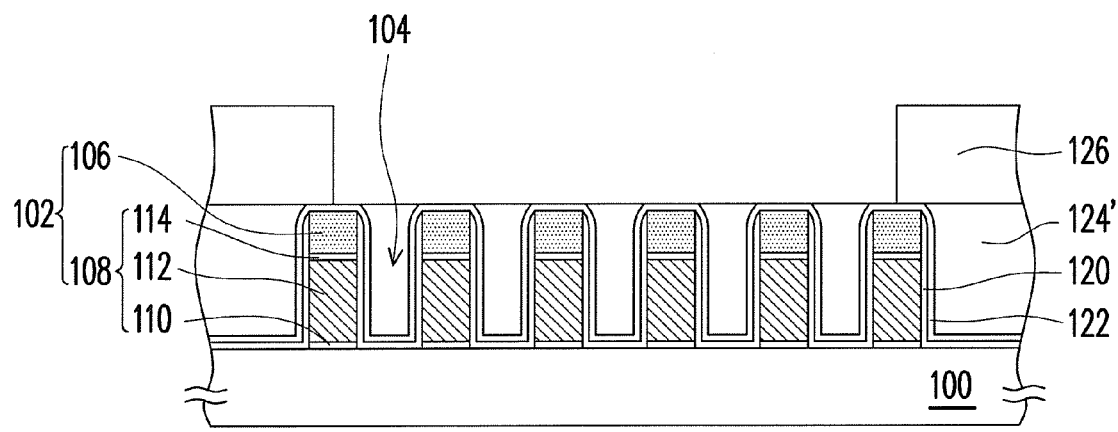

Afterwards, referring to FIGS. 1C and 2C, the filling layer 124 is planarized until the dielectric material layer 122 over the memory cells 102 is exposed, so as to form a planarized filling layer 124'. The filling layer is planarized with CMP, for example.

Then, a patterned mask layer 126 is formed on the filling layer 124' exposing a portion of the filling layer 124'. The material of the patterned mask layer 126 is a photoresist material, for example. The method of forming the patterned mask layer 126 utilizes a lithography process, for example.

Figure 1D:
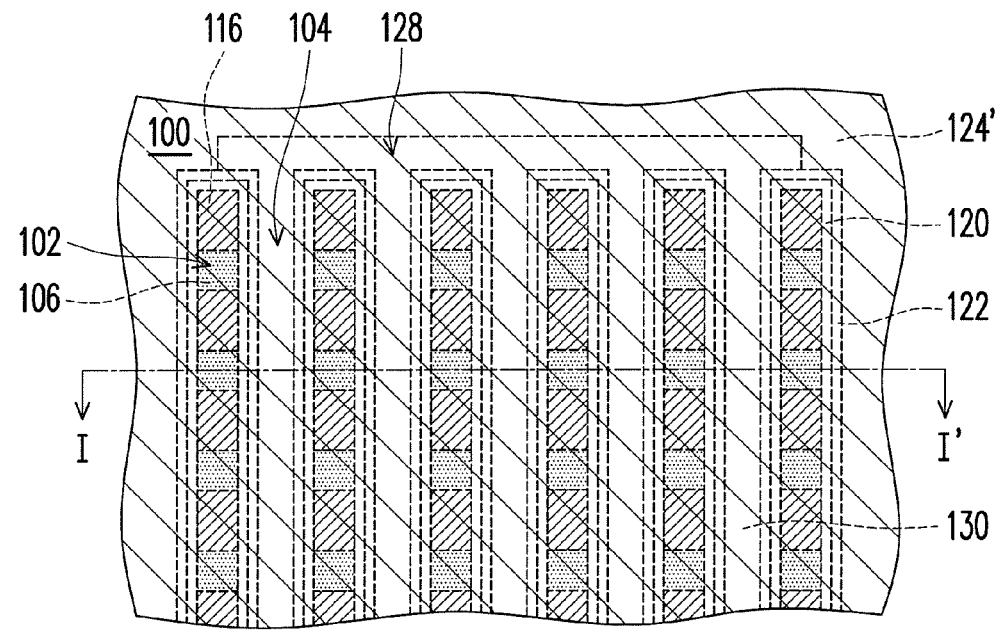
Figure 2D:
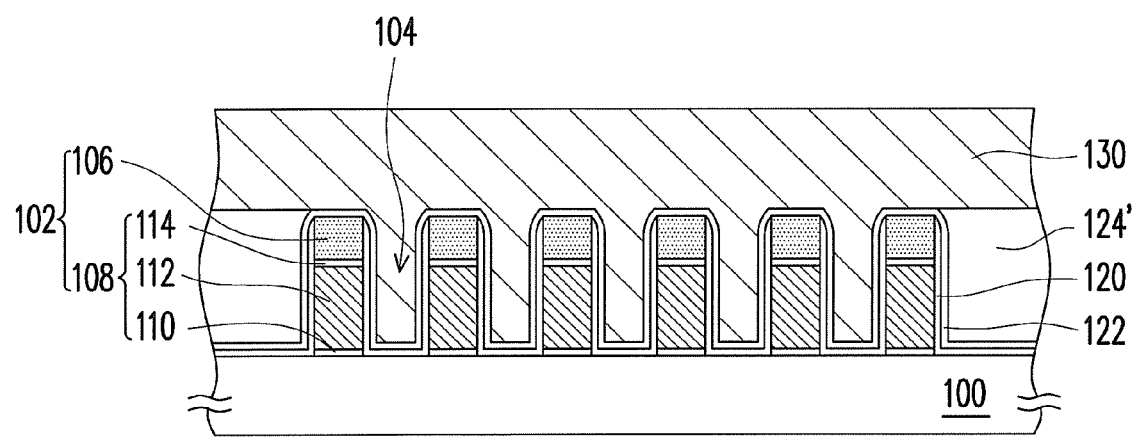

After that, referring to FIGS. 1D and 2D, with the patterned mask layer 126 as a mask, the portions of the filling layer 124' in the spaces 104 are removed, and an additional portion of the filling layer 124' is also removed to form a connection line opening 128 connecting the spaces 104. The method of removing the portions of the filling layer 124' may utilize a wet etching process.

Then, the patterned mask layer 126 is removed, possibly through dry stripping.

Next, a conductive layer 130 is formed over the substrate 100 filling the spaces 104 and the connection line opening 128. The material of the conductive layer 130 is, for example, doped polysilicon or metal. The method of forming the conductive layer 130 is CVD or physical vapor deposition (PVD).

Figure 1E:
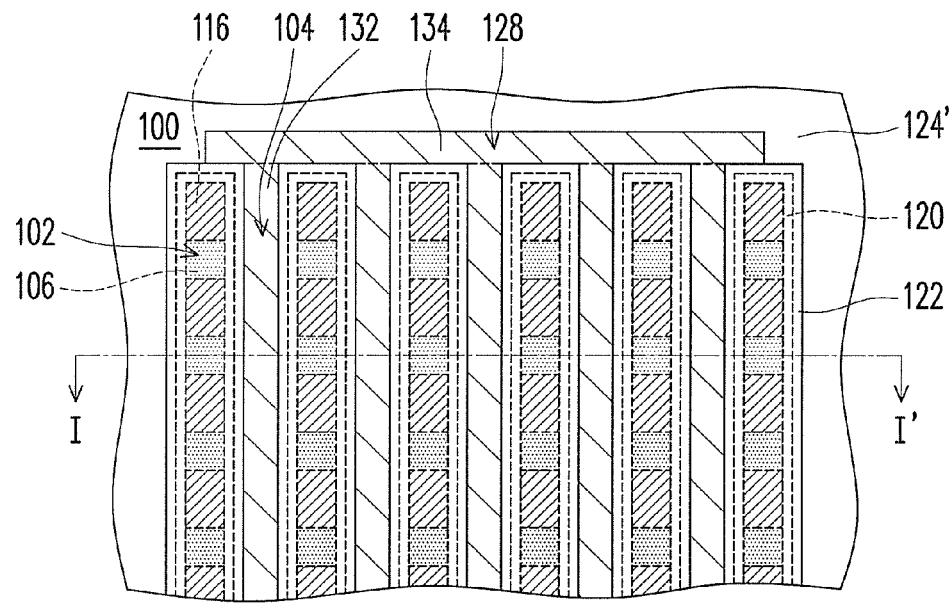
Figure 2E:
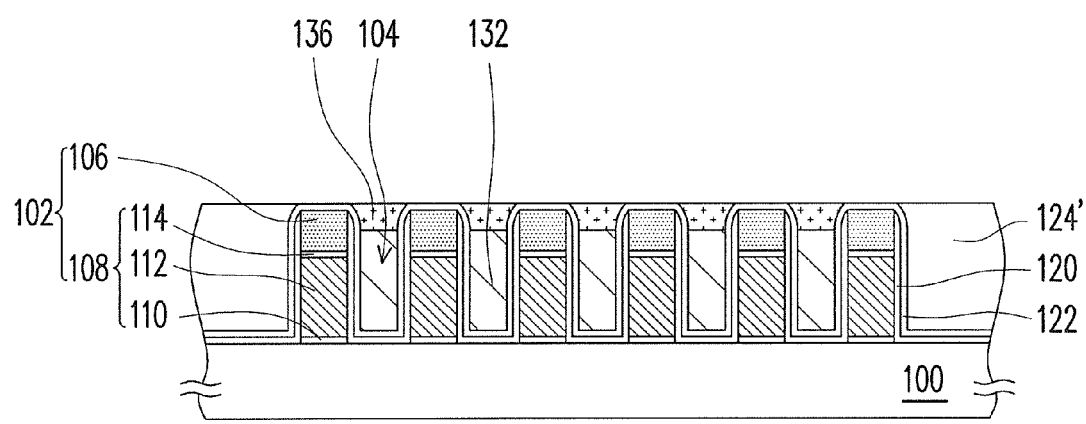

Afterwards, referring to FIGS. 1E and 2E, the conductive layer 130 is planarized until the dielectric material layer 122 over the memory cells 102 is exposed, so as to form SDI gates 132 in the spaces 104 as well as a connection line 134 in the connection line opening 128, wherein the SDI gates 132 and the connection line 134 fill the spaces 104 and the connection line opening 128 respectively. The SDI gates 132 are electrically connected with each other via the connection line 134. The method of planarizing the conductive layer 130 is CMP, for example. However, the method of forming the SDI gates 132 and the connection line 134 is not limited to the above mentioned.

Then, a silicide layer 136 (FIG. 2E) is optionally formed on each SDI gate 132 and the connection line 134 while the material of the SDI gates 132 is doped polysilicon, so as to improve the conductivity of the SDI gates 132 and the connection line 134. The material of the silicide layer 136 is $CoSi_2$, for example. The method of forming the silicide layer 136 utilizes a salicide process, for example.

Subsequent steps for completing the NAND flash memory fabrication are well known to persons of ordinary skills in the art and therefore not described here.

It is also noted that descriptions concerning select gates and their fabrication are omitted above for simplification. In a case where select gates are formed, additional SDI gates are each formed in the space between a memory cell 102 and a select gate.

In the following content, the junction-free NAND flash memory of the present embodiment is described on reference of FIGS. 1E and 2E.

Referring to FIGS. 1E and 2E, the junction-free NAND flash memory includes a substrate 100, a plurality of memory cells 102, a plurality of SDI gates 132 electrically connected with each other, and a dielectric material layer 122. The memory cells 102 are disposed on the substrate 100. Each memory cell 102 includes, for example, a control gate 106, and a composite layer 108 that is disposed between the control gate 106 and the substrate 100 and includes, for example, a bottom dielectric layer 110, a charge storage layer 112 and a top dielectric layer 114. Each SDI gate 132 is disposed between two neighboring memory cells 102. The dielectric material layer 122 is disposed between the memory cells 102 and the SDI gates 132 and between the SDI gates 132 and the substrate 100. The junction-free NAND flash memory optionally further includes spacers 120 and a connection line 134. Each spacer 120 is disposed between a memory cell 102 and an SDI gates 132. The connection line 134 electrically connects the SDI gates 132. Furthermore, the junction-free NAND flash memory optionally includes a silicide layer 136 disposed on each SDI gate 132 and the connection line 134, while the material of the SDI gates 132 is doped polysilicon. Since the materials, formation methods and functions of the elements within the above junction-free NAND flash memory have been described in details in the above descriptions of the fabricating process, detailed descriptions thereof are not repeated.

In the junction-free NAND flash memory fabricated as above, the SDI gates 132 can induce source/drain regions while applied with a suitable voltage, so that no source/drain region has to be formed in the substrate by doping. Therefore, the short channel effect could can be effectively suppressed, and punch-through leakage can be avoided.

Moreover, when the charge storage layers 112 are floating gates, each SDI gate 132 between two neighboring charge storage layers 112 can reduce the floating gate-floating gate coupling (FG-FG coupling) effect.

Furthermore, if a spacer 120 is formed between a memory cell 102 and an SDI gate 132, the disturbance of the memory cells 102 by the SDI gates 132 can be reduced.

Though this invention has been disclosed above by the preferred embodiments, they are not intended to limit this invention. Anybody skilled in the art can make some modifications and variations without departing from the spirit and scope of this invention. Therefore, the protecting range of this invention falls in the appended claims and their equivalents.

What is claimed is:

1. A junction-free NAND flash memory, comprising:
   a substrate;
   a plurality of memory cells on the substrate, wherein each memory cell comprises a charge storage layer;
   a plurality of source/drain inducing (SDI) gates electrically connected with each other, wherein each SDI gate is disposed between two neighboring memory cells; and
   a dielectric material layer, disposed between the memory cells and the SDI gates and between the SDI gates and the substrate.

2. The junction-free NAND flash memory of claim 1, wherein each memory cell comprises:
   a control gate; and
   a composite layer, disposed between the control gate and the substrate and comprising a bottom dielectric layer, the charge storage layer and a top dielectric layer.

3. The junction-free NAND flash memory of claim 2, wherein the charge storage layer comprises a charge trapping layer or a conductive layer.

4. The junction-free NAND flash memory of claim 1, wherein the SDI gates comprise a conductive material.

5. The junction-free NAND flash memory of claim 4, wherein the conductive material comprises doped polysilicon or metal.

6. The junction-free NAND flash memory of claim 5, further comprising a silicide layer disposed on each SDI gate, while the SDI gates comprise doped polysilicon.

7. The junction-free NAND flash memory of claim 1, wherein the dielectric material layer comprises silicon nitride.

8. The junction-free NAND flash memory of claim 1, further comprising a connection line electrically connecting the SDI gates.

9. The junction-free NAND flash memory of claim 1, further comprising a plurality of spacers, wherein each spacer is disposed between a memory cell and an SDI gate.

10. The junction-free NAND flash memory of claim 1, wherein the spacers comprise silicon oxide.

11. A method of fabricating a junction-free NAND flash memory, comprising:
    providing a substrate having a plurality of memory cells thereon, wherein each memory cell comprises a charge storage layer, and a space is formed between two neighboring memory cells;
    conformally forming a dielectric material layer on the substrate covering the memory cells; and
    forming a plurality of SDI gates electrically connected with each other, wherein each SDI gate fills the space between two neighboring memory cells.

12. The method of claim 11, wherein each memory cell comprises:
    a control gate; and
    a composite layer, disposed between the control gate and the substrate and comprising a bottom dielectric layer, the charge storage layer and a top dielectric layer.

13. The method of claim 11, further comprising forming a connection line connecting the SDI gates while forming the SDI gates.

14. The method of claim 13, wherein the step of forming the SDI gates and the connection line comprises:
    forming a filling layer over the substrate filling the spaces;
    planarizing the filling layer until the dielectric material layer over the memory cells is exposed;
    removing portions of the filling layer in the spaces and removing an additional portion of the filling layer to form a connection line opening that connects the spaces;
    forming a conductive layer over the substrate filling the spaces and the connection line opening;
    planarizing the conductive layer until the dielectric material layer over the memory cells is exposed; and
    forming a conductive layer in the spaces and in the connection line opening.

15. The method of claim 14, wherein the filling layer comprises a dielectric material.

16. The method of claim 14, wherein the step of planarizing the filling layer comprises a chemical mechanical polishing (CMP) process.

17. The method of claim 14, wherein the step of planarizing the conductive layer comprises a CMP process.

18. The method of claim 11, further comprising forming spacers on sidewalls of the memory cells respectively before the dielectric material layer is formed.

19. The method of claim 18, wherein the step of forming the spacers comprises:
    conformally forming a spacer material layer on the substrate covering the memory cells; and
    performing an etching back process to the spacer material layer.

20. The method of claim 11, wherein the SDI gates comprises doped polysilicon or metal.

21. The method of claim 20, further comprising forming a silicide layer on each of the SDI gates while the SDI gates comprise doped polysilicon.

* * * * *